(12) United States Patent
Ngai et al.

(10) Patent No.: US 9,815,091 B2
(45) Date of Patent: Nov. 14, 2017

(54) ROLL TO ROLL WAFER BACKSIDE PARTICLE AND CONTAMINATION REMOVAL

(71) Applicant: Applied Materials, Inc., Santa Clara, CA (US)

(72) Inventors: Christopher S. Ngai, Burlingame, CA (US); Huixiong Dai, San Jose, CA (US); Ludovic Godet, Sunnyvale, CA (US); Ellie Y. Yieh, San Jose, CA (US)

(73) Assignee: APPLIED MATERIALS, INC., Sant, CA (US)

( * ) Notice: Subject to any disclaimer, the term of this patent is extended or adjusted under 35 U.S.C. 154(b) by 480 days.

(21) Appl. No.: 14/476,398

(22) Filed: Sep. 3, 2014

(65) Prior Publication Data
US 2015/0371879 A1    Dec. 24, 2015

Related U.S. Application Data

(60) Provisional application No. 62/014,278, filed on Jun. 19, 2014.

(51) Int. Cl.
| B08B 7/00 | (2006.01) |
| B08B 1/00 | (2006.01) |
| H01L 21/46 | (2006.01) |
| H01L 21/687 | (2006.01) |
| H01L 21/67 | (2006.01) |
| H01L 21/683 | (2006.01) |
| B08B 6/00 | (2006.01) |

(52) U.S. Cl.
CPC ............... *B08B 1/001* (2013.01); *B08B 1/00* (2013.01); *B08B 6/00* (2013.01); *B08B 7/0028* (2013.01);
(Continued)

(58) Field of Classification Search
CPC ... B08B 1/00; B08B 1/001; B08B 1/003; B08B 1/006; B08B 1/008; B08B 11/00;
(Continued)

(56) References Cited

U.S. PATENT DOCUMENTS

| 5,555,902 A | 9/1996 | Menon |
| 5,753,563 A | 5/1998 | Guan et al. |

(Continued)

FOREIGN PATENT DOCUMENTS

| JP | 7-275805 | * 10/1995 |
| JP | 10-98090 | * 4/1998 |

(Continued)

OTHER PUBLICATIONS

International Search Report and Written Opinion of related application PCT/US2015/033005 dated Aug. 28, 2015.

*Primary Examiner* — Mark Spisich
(74) *Attorney, Agent, or Firm* — Patterson + Sheridan LLP

(57) ABSTRACT

Particulate cleaning assemblies and methods for cleaning are disclosed. In one example, a device for removing particles from a backside surface of a substrate is described. The device includes a chamber body with a substrate chucking device, a particulate cleaning article positioned over the substrate supporting surface, an optical sensing device positioned under the particulate cleaning article and a substrate positioning device separates the particulate cleaning article and a substrate. In another example, a method for removing particles from a substrate is disclosed. The method includes positioning a substrate with a processing surface and a supporting surface in a process chamber. At least a portion of the substrate can be chucked to a substrate chucking device, the substrate chucking device having a substrate supporting surface with a particulate cleaning article positioned thereon. The substrate is then separated from the particulate cleaning article leaving particles behind.

20 Claims, 3 Drawing Sheets

(52) U.S. Cl.
CPC .. *H01L 21/67028* (2013.01); *H01L 21/67253* (2013.01); *H01L 21/6831* (2013.01); *H01L 21/68742* (2013.01); *B08B 1/008* (2013.01)

(58) Field of Classification Search
CPC ..... B08B 11/02; B08B 11/04; H01L 21/0209; H01L 21/02096; H01L 21/304; H01L 21/67; H01L 21/67028; H01L 21/67046; H01L 21/673; H01L 21/677; H01L 21/68; H01L 21/683; H01L 21/6831; H01L 21/6833; H01L 21/6838; H01L 21/687; H01L 21/68742
USPC .............................................. 15/3, 97.1, 102
See application file for complete search history.

(56) References Cited

U.S. PATENT DOCUMENTS

| | | |
|---|---|---|
| 5,972,051 A | 10/1999 | Leroux et al. |
| 6,374,834 B1 | 4/2002 | Abe et al. |
| 6,695,917 B2 * | 2/2004 | Wright .................... B05C 1/027 118/257 |
| 7,997,958 B2 | 8/2011 | Ramarajan |
| 2001/0021627 A1 | 9/2001 | Elledge |
| 2003/0066543 A1 | 4/2003 | Muscato et al. |
| 2005/0210610 A1 * | 9/2005 | Louie ....................... B41J 29/17 15/102 |
| 2007/0125491 A1 * | 6/2007 | Yonemizu ......... H01L 21/67011 156/285 |
| 2007/0161332 A1 | 7/2007 | Bastian et al. |
| 2008/0184505 A1 * | 8/2008 | Feroli .................... A46B 13/00 15/21.1 |
| 2009/0250077 A1 * | 10/2009 | Harano ..................... B08B 6/00 134/1 |

FOREIGN PATENT DOCUMENTS

| | | | |
|---|---|---|---|
| JP | 10-242099 | * | 9/1998 |
| JP | 2002-83795 | * | 3/2002 |
| JP | 2003-53281 | * | 2/2003 |

\* cited by examiner

ROLL TO ROLL WAFER BACKSIDE PARTICLE AND CONTAMINATION REMOVAL

CROSS-REFERENCE TO RELATED APPLICATIONS

This application claims priority to U.S. Provisional Patent Application Ser. No. 62/014,278, filed Jun. 19, 2014, which application is hereby incorporated by reference herein.

BACKGROUND

Field

Embodiments of the invention generally relate to an apparatus and method for removing particles from substrates or wafers, more particularly, to a cleaning article and a method of using the same for chemical mechanical polishing.

Description of the Related Art

The geometry of semiconductor devices has decreased dramatically in size since such devices were first introduced several decades ago. Integrated circuits have generally followed the two year/half-size rule (often called "Moore's Law") which states that the number of devices fitting on a chip will double every two years. Today's wafer fabrication plants are routinely producing integrated circuits having 0.5 and even 0.35 micron feature sizes, and tomorrow's plants soon will be producing devices having even smaller geometries.

During deposition and processing of material layers making up these semiconductor devices, improved control over criteria such as particle generation and contamination is necessary to ensure that deposited layers meet the stringent specifications of manufacturers. In order to meet processing demands created by such small scale geometry devices, new technology for substrate processing equipment is constantly being developed. For example, as device sizes become smaller and integration density increases, issues not previously considered important are emerging as areas of concern. One such issue is backside wafer contamination.

Particle contamination on the backside of wafers has become a serious issue in advanced microelectronics manufacturing for several reasons. One reason is that particles on the backside of the wafer can cause cross contamination and electrical contact failures in interconnect structures.

A second reason for the importance to minimize wafer backside particle contamination is change in wafer planarity associated with such contamination. Specifically, particles present on the backside of the wafer can impact control over the critical dimension (CD) in lithographic processes by causing wafer warpage. The depth of focus in sub-half micron lithography is approximately ±0.5 µm, and factors such as field image curvature, circuit topography, wafer flatness and auto-focus errors reduce the usable focus margin. Therefore, ensuring the planarity of wafers during the lithographic process becomes more critical in obtaining tight CD control.

Anti-reflective coatings (ARC) formed by plasma-enhanced chemical vapor deposition (PECVD) have been widely used to control CD during photolithography processing steps by suppressing over 99% of light reflected from a substrate. In general however, wafers that have received an ARC film must generally be subjected to additional processing steps in order to remove particles on the wafer backside before the wafer is exposed to lithography steps.

Therefore, there is a need in the art for methods and apparatuses which reduce particle contamination on the wafer backside prior to lithography processes.

SUMMARY

In one embodiment, a device for removing particles from a substrate is described. The device includes a substrate chucking device having a substrate supporting surface. The device can further include a supply assembly and a take up assembly. The supply assembly and the take-up assembly can be configured to receive a particulate cleaning article, having a path for the particulate cleaning article over and in contact with the substrate supporting surface. An optical sensing device can be positioned under the particulate cleaning article. The device can further have a substrate positioning device, the substrate positioning device being configured to separate the particulate cleaning article and a substrate.

In another embodiment, a method for removing particles from the backside of a substrate is disclosed. The method can include chucking at least a portion of a backside of a substrate to a substrate chucking device. The substrate chucking device can have a substrate supporting surface and one or more lift pins. The substrate supporting surface can have a particulate cleaning article positioned thereon, the particulate cleaning article having one or more openings. The substrate can then be separated from the particulate cleaning article, with at least a portion of the plurality of particles adhering and transferring to the particulate cleaning article. With the particles adhered to the particulate cleaning article, the particulate cleaning article can be indexed such that one or more openings are positioned over the one or more lift pins.

In another embodiment, a device for removing particles from a substrate is disclosed. The device can include a substrate chucking device having a substrate supporting surface and a plurality of lift pins. An advanceable particulate cleaning article can be positioned over the substrate supporting surface, the particulate cleaning article having a plurality of lift pin openings formed therein. The device can further include an optical sensing device, the optical sensing device being configured to provide a metric for positioning the particulate cleaning article on the substrate chucking device.

BRIEF DESCRIPTION OF THE DRAWINGS

So that the manner in which the above recited features can be understood in detail, a more particular description, briefly summarized above, may be had by reference to embodiments, some of which are illustrated in the appended drawings. It is to be noted, however, that the appended drawings illustrate only typical embodiments and are therefore not to be considered limiting of its scope, for the devices and methods described herein may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Devices and methods for removing backside particles from a substrate are disclosed herein. Backside particles can affect the angle and the intensity of radiation delivered to a substrate, such as defocus and overlay shift during lithography. Described here, the particles present on the backside of the substrate can be adhered to an adhesive film. The adhesive film is then separated from the substrate for subsequent disposal or reused, depending on the particle saturation on the adhesive. In this way, backside particles can be adhered and removed from the substrate. The substrate can then undergo subsequent processing while avoiding the above described problems.

Figure 1:
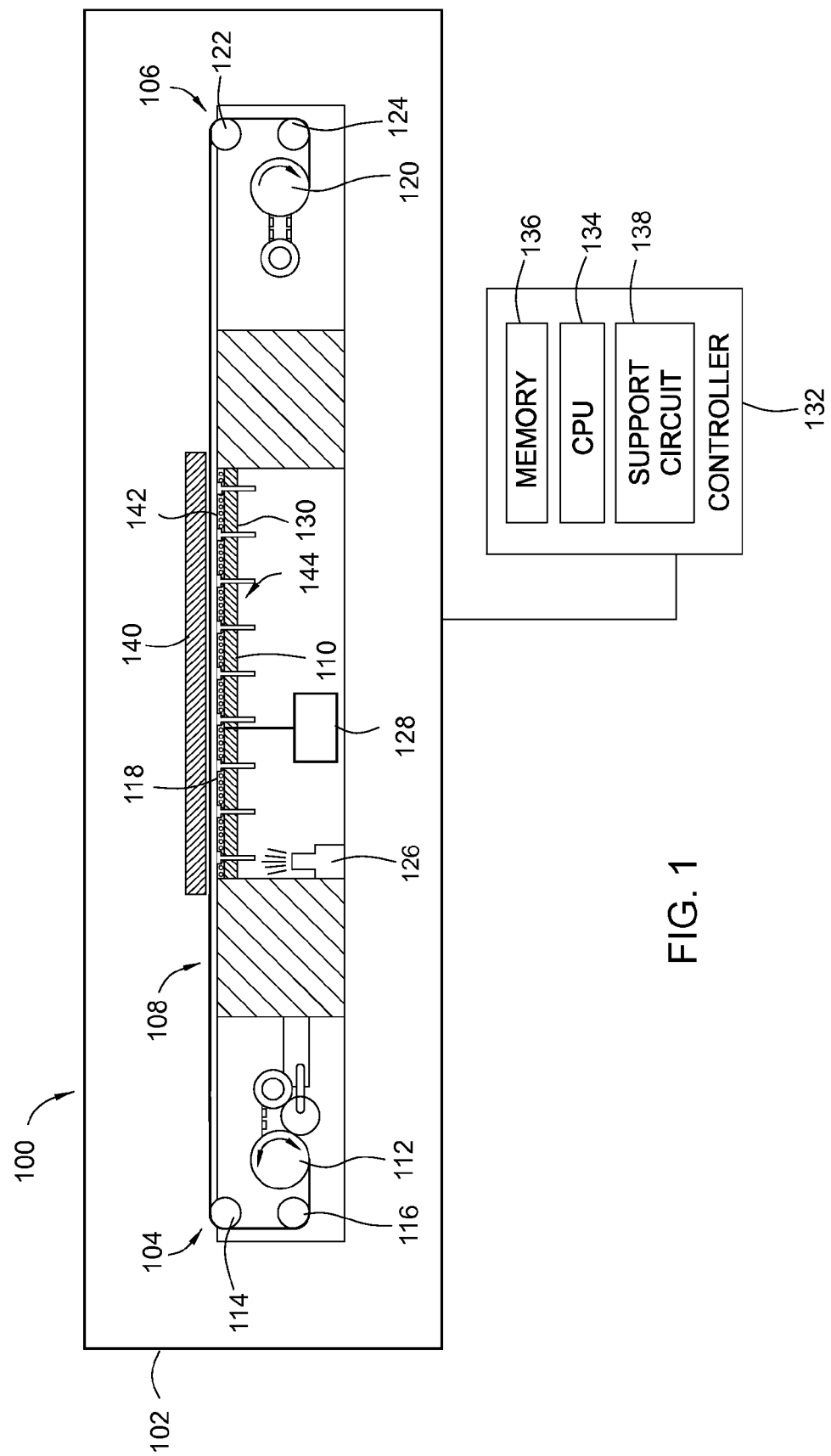
FIG. 1 is a side view of a particulate cleaning assembly.

FIG. 1 depicts a side view of the particulate cleaning assembly 100, according to one embodiment. The particulate cleaning assembly 100 may be part of a process chamber having a chamber body 102. The particulate cleaning assembly 100 further includes an exemplary supply assembly 104 and a take up assembly 106, which act in conjunction to the position of the particulate cleaning article 108 across a platen 110. Generally, the supply assembly 104 includes an upper guide member 114 and a lower guide member 116 and can optionally include the supply roll 112. The supply roll 112 generally contains an unused portion of particulate cleaning article 108. The supply roll 112 is configured so that it may easily be replaced with another supply roll 112 containing a new particulate cleaning article 108 once the particulate cleaning article 108 disposed on the supply roll 112 has been consumed by the particulate cleaning process.

The particulate cleaning article 108 comprises an adhesive material. The adhesive material is flexible and has a cohesive strength such that particles may be removed from a substrate. In one implementation, the particulate cleaning article 108 is a polyimide layer.

The lower guide member 116 is positioned to lead the particulate cleaning article 108 from the supply roll 112 to the upper guide member 114. The upper guide member 114 is disposed such that the particulate cleaning article 108 leading off the upper guide member 114 is disposed substantially coplanar, i.e., lies immediately adjacent and parallel, to the substrate supporting surface 118 of the platen 110.

Generally, the take-up assembly 106 includes an upper guide member 122 and a lower guide member 124 and can optionally include the take-up roll 120. The take-up roll 120 generally contains a used portion of particulate cleaning article 108 and is configured so that it may easily be replaced with an empty take-up roll, once take-up roll 120 is filled with used particulate cleaning article 108. The upper guide member 122 is positioned to lead the particulate cleaning article 108 from the platen 110 to the lower guide member 124. The lower guide member 124 leads the particulate cleaning article 108 onto the take-up roll 120. The particulate cleaning assembly 100 may also comprise an optical sensing device 126, such as a laser or a camera, adapted to transmit and receive optical signals for detecting the positioning and state of saturation for the particulate cleaning article 108 as used in the particle removal process performed on the substrate.

The particulate cleaning article 108 is generally moved in relation to the platen 110 by balancing the forces between a motor or brake coupled to the supply assembly 104 and a motor coupled to the take-up assembly 106. The optical sensing device 126 can then provide information to a controller 132 connected to the platen 110 regarding the position of the particulate cleaning article 108.

The platen 110 can further include an electrode 142 and a power supply 128, which together are referred to as a substrate chucking device 144. The power supply 128 can be connected to an electrode 142 disposed in the platen 110. When power is applied to the electrode 142, an electrostatic charge is generated by the electrode 142 at the substrate supporting surface 118. The electrostatic charge generated by the electrode 142 can then chuck a substrate 140 to the substrate supporting surface 118 of the platen 110. When chucked to the platen 110, the backside of the substrate 140 is urged against the particulate cleaning article 108.

Figure 2:
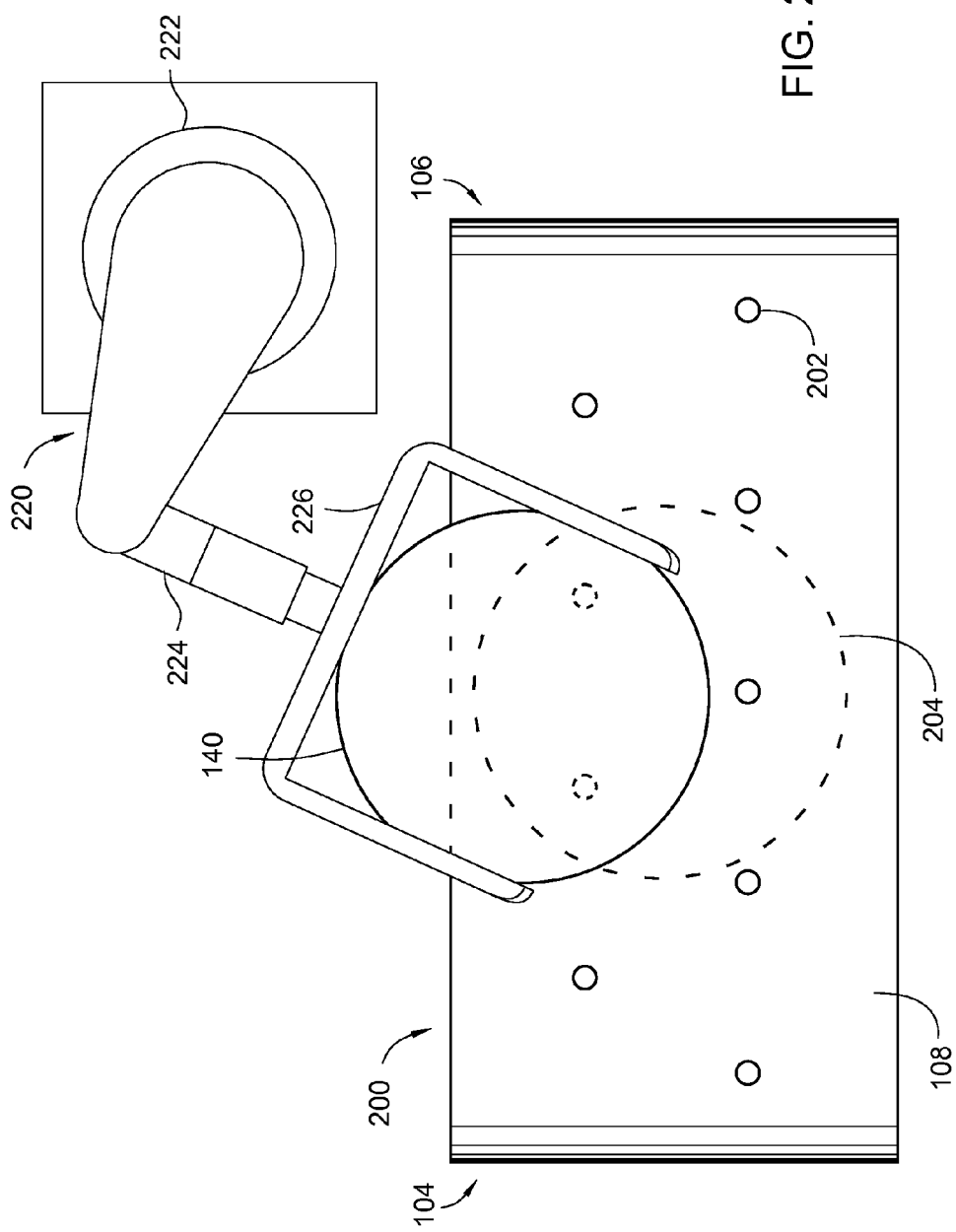
FIG. 2 is a overhead view of a particulate cleaning assembly, according to another implementation.

The platen 110 can further include a plurality of lift pins 130. The lift pins 130 can be positioned such that they penetrate through openings in the particulate cleaning article 108. One or more openings (such as shown in FIG. 2) may be formed in the particulate cleaning article 108. The size of the one or more openings may be commensurate with or larger than the size of the lift pins 130.

The controller 132 may be connected with the particulate cleaning assembly 100 to facilitate control of the particulate cleaning assembly 100 as described above. The controller 132 comprises a central processing unit (CPU) 134, support circuits 138 and memory 136. The CPU 134 may be one of any form of computer processor that can be used in an industrial setting for controlling various drives, robots and sub-processors. The memory 136 is coupled to the CPU 134. The memory 136, or computer-readable medium, may be one or more of readily available memory such as random access memory (RAM), read only memory (ROM), floppy disk, hard disk, or any other form of digital storage, local or remote. The support circuits 138 are coupled to the CPU 134 for supporting the processor in a conventional manner. These circuits include cache, power supplies, clock circuits, input/output circuitry, subsystems, and the like.

In operation, the substrate 140 including backside particles is positioned on the particulate cleaning article 108 over the platen. The substrate 140 can be positioned using a variety of apparatus or techniques, such as a robotic arm. The substrate 140 is then chucked to the platen 110 using an electrostatic charge generated by the power supply 128. The particulate cleaning article 108 can be adhesive. In another example, the particulate cleaning article 108 is a non-adhesive film. The particles present on the backside of the substrate 140 adhere to the particulate cleaning article 108 and thus are transferred to the particulate cleaning article 108. After allowing time for the particles to adhere to the particulate cleaning article 108, the power creating the electrostatic charge from the power supply 128 at the platen 110 is stopped. The substrate 140 is then lifted from the particulate cleaning article 108 using the plurality of lift pins 130. The optical sensing device 126 can determine the particle density of the exposed portion of the particulate cleaning article 108, i.e., the quantity of particles per surface area in the portion of the particulate cleaning article 108 which received the substrate 140, to determine if the exposed portion of the particulate cleaning article 108 is saturated or not. The optical sensing device 126 can then provide signals which the controller 132 uses to determine whether to reposition the particulate cleaning article 108 or not. If the exposed portion of the particulate cleaning article 108 is saturated, the particulate cleaning article 108 is repositioned such that the saturated portion will not contact a next substrate (not shown) processed on the platen 110. For example, the supply assembly 104 can advance an unused portion of the particulate cleaning article 108 over the platen 110 while the take up assembly 106 receives saturated particulate cleaning article 108 in a roll to roll fashion.

In another embodiment, the particulate cleaning article 108 is changed without further detection. Here, the particulate cleaning article 108 is advanced without consideration of the particle density attached, such as after every substrate 140, after a certain period of time or after a certain amount of surface area has been cleaned.

FIG. 2 depicts a side view of another particulate cleaning assembly 200. The particulate cleaning assembly 200 uses a robotic arm 220 in lieu of or in combination with electrostatic chucking to secure the substrate 140 to the particulate cleaning article 108. The particulate cleaning assembly 200 can be part of a processing device, as described with reference to FIG. 1. The particulate cleaning assembly 200 can include one or more components described with reference to FIG. 1, including the supply assembly 104, the take up assembly 106 and the particulate cleaning article 108. The particulate cleaning article 108 can be positioned over the platen 110, shown with reference to FIG. 1.

A plurality of openings 202 can be formed in the particulate cleaning article 108. The openings 202 can be of an appropriate diameter and position such that the lift pins 130 can pass through without lifting the particulate cleaning article 108. The openings are positioned over the lift pins 130 using the optical sensing device 126, described with reference to FIG. 1. The openings 202 may be of any shape, such as circular, oval, rectangular or other more complex shapes. Further, there may be more or fewer openings 202 and the openings 202 need not be positioned uniformly.

The robotic arm 220 includes a base 222, an extension portion 224 and a substrate carrier 226. The robotic arm 220 can be composed of one or more of a variety of materials, such as stainless steel, aluminum or others. The extension portion 224 can provide controlled motion of the substrate carrier 226. The extension portion 224 can move with 6 degrees of freedom. In another embodiment, one or more degrees of freedom are locked during operation. The substrate carrier 226 carries the substrate 140 while making minimal contact with the substrate 140.

In operation, the robotic arm 220 receives the substrate 140 using the substrate carrier 226. The substrate 140 may have a plurality of backside particles. The substrate carrier 226 is positioned precisely over the particulate cleaning article 108 by appropriately controlled movement of both the base 222 and the extension portion 224, as controlled by the controller 132. The robotic arm 220 then positions the backside of the substrate 140 in contact with the particulate cleaning article 108. The robotic arm 220 may either remain in place or separate from the substrate 140. In either case, the substrate 140 may be electrostatically chucked to the platen 110 at position 204, as described with reference to FIG. 1. After an appropriate amount of time to allow particles present on the backside of the substrate 140 adhere to the particulate cleaning article 108, the substrate 140 is lifted from the particulate cleaning article 108, either using the lift pins 130 or using the robotic arm 220. The particulate cleaning article 108 is then advanced based on time, particle density number of substrates cleaned or combinations thereof, as described above. The optical sensing device 126 can then provide signals which the controller 132 uses to determine the position of the particulate cleaning article 108. The particulate cleaning article 108 can then be repositioned over the platen 110 for contact with a second substrate (not shown).

Figure 3:
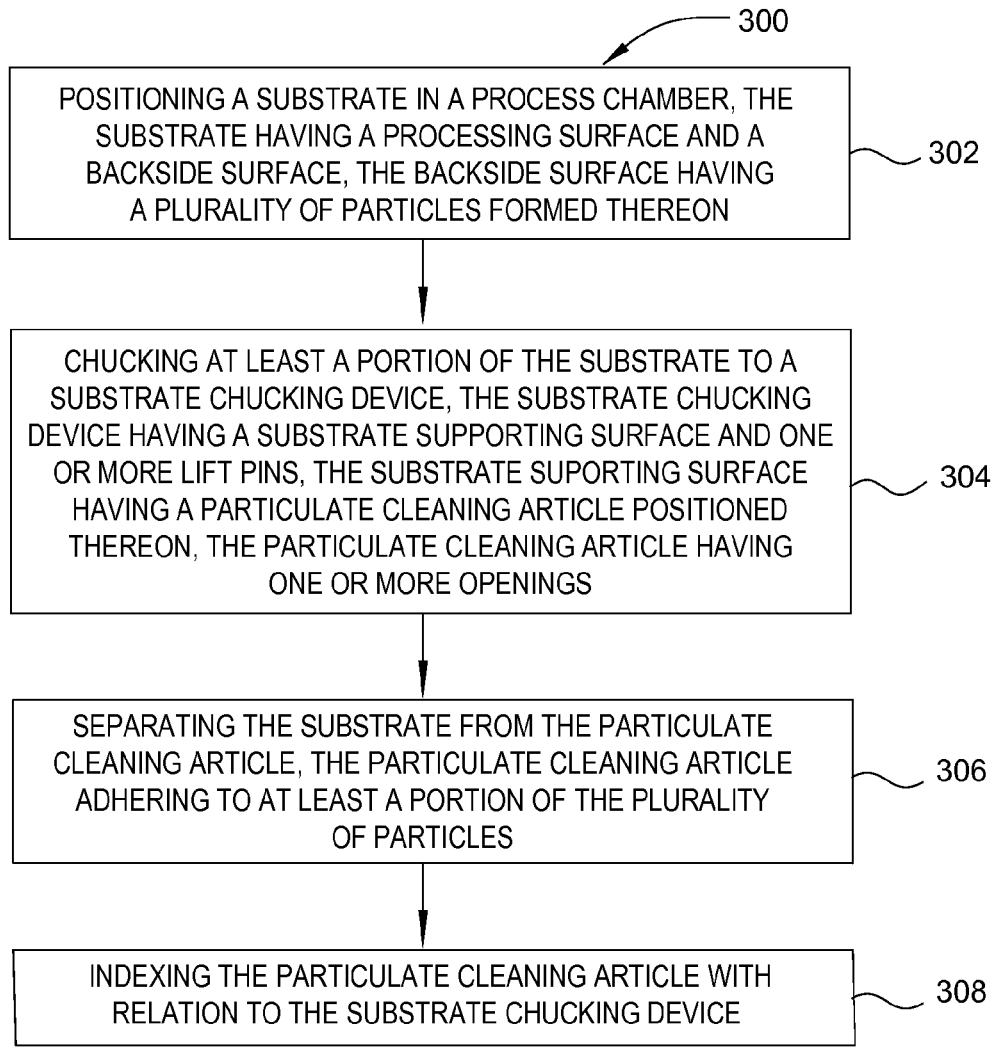
FIG. 3 is a block diagram of a method of removing particulate matter.

FIG. 3 is a block diagram of a method of removing particles from a substrate. The method 300 includes positioning the substrate in a process chamber, the substrate having a backside surface, the backside surface having a plurality of particles formed thereon, at block 302. Chucking at least a portion of the substrate to a substrate chucking device, at block 304. The substrate chucking device has a substrate backside surface with a particulate cleaning article positioned thereon. The substrate is separated from the particulate cleaning article, with at least a portion of the plurality of particles present on the backside surface of the substrate adhering and transferring to the particulate cleaning article, at block 306. By employing a process chamber including an adherent film, particles having a mean diameter of 1 μm or less can be effectively removed from the backside surface of the substrate.

The method 300 can be used with substrate having any composition useable for semiconductor applications, such as a silicon, epoxy or quartz substrate. In one embodiment, the substrate is substantially composed of glass. The substrate can be of a broad range of dimensions (e.g., length, width, shape, thickness, etc). In one example, the substrate is approximately 1 meter long and 1 meter wide. The method 300 can be performed in a process chamber such as the process chamber described with reference to FIGS. 1 and 2.

With the substrate in the chamber, at least a portion of the substrate is chucked to the substrate chucking device and thus held against the particulate cleaning article, at block 304. The substrate can be held in proximity of the substrate chucking device using mechanical devices, such as a robot arm or clamps, or is can be held using an electrostatic charge. The substrate chucking device has a substrate backside surface with the particulate cleaning article positioned thereon. The particulate cleaning article can be a particulate cleaning article as described with reference to FIGS. 1 and 2.

Then, the substrate is separated from the particulate cleaning article, with at least a portion of the plurality of particles present on the backside of the substrate adhering and transferring to the adhesive of the particulate cleaning article, at block 306. The substrate is separated from the particulate cleaning article, such as by lift pins, using a robotic arm or combinations thereof. Once detached, the substrate is transferred for further processing.

With the substrate separated from the particulate cleaning article, the particulate cleaning article is then indexed, at block 308. Indexing as used herein including determining the first or current position of the particulate cleaning article with relation to the one or more openings and the substrate chucking device. The first position is then relayed to the controller. The controller then adjusts the particulate cleaning article based on the relayed position. The position of the particulate cleaning article is adjusted to a second position such that a portion of the particulate cleaning article is appropriately positioned over a corresponding portion of the substrate chucking device. For example, the openings of the particulate cleaning article can be positioned over the lift pins of the substrate chucking device, described with reference to FIG. 2.

Once the particles have been removed from the backside surface of the substrate, the substrate can be transferred for further processing. In one example, the substrate is transferred to a second process chamber for a lithography process.

The method described herein allows for backside particulate to be removed prior to processing. The exchangeable particulate cleaning article allows for high throughput without loss in cleaning quality. As described above, backside particles can lead to various types of device failure, such as cross contamination and electrical contact failures in interconnect structures as well as substrate warpage due to lack of control over the critical dimension in lithographic processes. By cleaning the backside of the substrate of particulate prior to further processing, these sources of device failure can be avoided.

While the foregoing is directed to embodiments of the devices and methods described herein, other and further embodiments may be devised without departing from the basic scope thereof, and the scope thereof is determined by the claims that follow.

The invention claimed is:

1. A device for removing particles from the backside of a substrate, comprising:
    a substrate chucking device having a substrate supporting surface;
    a supply assembly and a take up assembly configured to receive a particulate cleaning article, having a path for the particulate cleaning article over and in contact with the substrate supporting surface, the supply assembly and the take up assembly being positioned on opposite ends of the substrate chucking device, and below a plane of the substrate chucking device; and
    a substrate positioning device configured to separate the particulate cleaning article and a substrate.

2. The device of claim 1, wherein the substrate positioning device comprises a plurality of lift pins.

3. The device of claim 2, wherein the particulate cleaning article has a plurality of openings configured to align with the lift pins.

4. The device of claim 1, wherein the substrate chucking device comprises an electrode configured to provide an electrostatic force.

5. The device of claim 1, wherein the particulate cleaning article is a web.

6. The device of claim 1, further comprising an optical sensing device, wherein the optical sensing device is a laser.

7. The device of claim 6, wherein the optical sensing device determines both a position and a saturation of the particulate cleaning article.

8. The device of claim 1, wherein the particulate cleaning article is a linear adhesive film, and wherein the linear adhesive film is non-adhesive to the substrate supporting surface.

9. The device of claim 1, wherein the substrate positioning device comprises a robotic arm.

10. A device for removing particles from a substrate, comprising:
    a substrate chucking device having a substrate supporting surface and a plurality of lift pins;
    a supply assembly and a take up assembly configured to receive an advanceable particulate cleaning article, the supply assembly and the take up assembly being positioned on opposite ends of the substrate chucking device, and below a plane of the substrate chucking device;
    the advanceable particulate cleaning article positioned over the substrate supporting surface, the particulate cleaning article having a plurality of lift pin openings formed therein; and
    an optical sensing device configured to provide a metric for positioning the particulate cleaning article on the substrate chucking device.

11. The device of claim 10, wherein the optical sensing device determines both the position and the saturation of the particulate cleaning article.

12. The device of claim 10, wherein the substrate chucking device comprises an electrode configured to provide an electrostatic force.

13. The device of claim 10, wherein the particulate cleaning article includes an adhesive layer disposed on a side of the particulate cleaning article facing away from the substrate supporting surface.

14. The device of claim 10, further comprising a robotic arm configured to position the substrate on the particulate cleaning article.

15. The device of claim 10, wherein the particulate cleaning article is a web.

16. A device for removing particles from the backside of a substrate, comprising:
    a substrate chucking device having a substrate supporting surface;
    a supply assembly and a take up assembly configured to receive a particulate cleaning article, having a path for the particulate cleaning article over and in contact with the substrate supporting surface, the supply assembly and the take up assembly being positioned on opposite ends of the substrate chucking device, and below a plane of the substrate chucking device; and
    a substrate positioning device configured to separate the particulate cleaning article and a substrate, the substrate positioning device having at least one lift pin and the particulate cleaning article having at least one opening configured to align with the at least one lift pin.

17. The device of claim 16, wherein a plurality of the lift pins extend between opposite ends of the substrate chucking device, such that coverage of the lift pins extends an entire width of the substrate chucking device.

18. The device of claim 16, wherein the substrate chucking device comprises an electrode configured to provide an electrostatic force.

19. The device of claim 16, further comprising an optical sensing device, wherein the optical sensing device is a laser.

20. The device of claim 19, wherein the optical sensing device determines both a position and a saturation of the particulate cleaning article.

* * * * *